United States Patent [19]

Mensz

[11] Patent Number: 5,422,902
[45] Date of Patent: Jun. 6, 1995

[54] BETE-ZNSE GRADED BAND GAP OHMIC CONTACT TO P-TYPE ZNSE SEMICONDUCTORS

[75] Inventor: Piotr M. Mensz, Ossining, N.Y.

[73] Assignee: Philips Electronics North America Corporation, New York, N.Y.

[21] Appl. No.: 87,307

[22] Filed: Jul. 2, 1993

[51] Int. Cl.⁶ .......................... H01S 3/19; H01L 33/00
[52] U.S. Cl. ........................ 372/43; 372/44; 372/45; 372/46; 257/200; 257/201
[58] Field of Search .................. 372/43, 44, 45, 46; 257/200, 201

[56] References Cited

U.S. PATENT DOCUMENTS

| | | | |
|---|---|---|---|
| 3,933,538 | 1/1976 | Akai et al. | 252/62.3 |
| 4,801,984 | 1/1989 | Woodall | 357/16 |
| 4,949,348 | 8/1990 | Nguyen et al. | 372/41 |
| 5,055,363 | 10/1991 | Tomomura et al. | 428/690 |
| 5,060,233 | 10/1991 | Harder et al. | 372/22 |
| 5,068,204 | 11/1991 | Kukimoto et al. | 437/127 |
| 5,100,832 | 3/1992 | Kitagawa et al. | 437/106 |
| 5,103,269 | 4/1992 | Tomomura et al. | 357/17 |
| 5,113,233 | 5/1992 | Kitagawa et al. | 357/17 |
| 5,140,385 | 8/1992 | Kukimoto et al. | 357/17 |
| 5,162,891 | 11/1992 | Burroughes et al. | 257/183 |
| 5,187,116 | 2/1993 | Kitagawa et al. | 437/105 |
| 5,198,690 | 3/1993 | Kitagawa et al. | 257/200 |
| 5,213,998 | 5/1993 | Qiu et al. | 437/185 |

FOREIGN PATENT DOCUMENTS

| | | |
|---|---|---|
| 0346120 | 12/1989 | European Pat. Off. |
| 0475606 | 3/1992 | European Pat. Off. |
| 463479 | 2/1992 | Japan . |
| 9221170 | 11/1992 | WIPO . |

OTHER PUBLICATIONS

"Blue-Green Injection Lasers Containing Peudomorphic . . . ", Gaines et al., Appl. Phys. Lett. 52 (20) 17 May 1993.
"Synthesis and Some Properties of BeTe, BeSe and BeS", Yim et al., J. Phys. Chem. Solids, 1972, vol. 33, pp. 501–505.
"Electronic Energy Bands of BeS, BeSe and BeTe", Sarkar et al., J. Phys. Solid State Phys., vol. 10, 1977, pp. 57–62.
Abstract of Japanese Publication No. 63-44786, Yoichiro Oota, Feb. 25, 1988, (Kokai).
Patent Abstract of Japanese Publication No. 1-218086, Ota, Aug. 31, 1984, (Kokai).
Patent Abstract of Japanese Publication No. 4-63479, Kitagawa, Feb. 28, 1992, (Kokai).

*Primary Examiner*—Rodney B. Bovernick
*Assistant Examiner*—Hemang Sanghavi
*Attorney, Agent, or Firm*—Ernestine C. Bartlett

[57] ABSTRACT

The present invention relates to semiconductor devices with ohmic contact to ZnSe-based layers and lasers derived therefrom wherein BeTe is used in a graded band gap layer. Preferably, an ohmic contact layer of BeTe-containing graded composition is used which consists essentially of $Be_xZn_{1-x}Te_xSe_{1-x}$ wherein x is within the range of 0 and 1 selected so as to provide substantial lattice matching to the lattice structure c the substrate. Specifically, $Be_xZn_{1-x}Te_xSe_{1-x}$ graded gap semiconductor layers are provided for application as ohmic contacts to p-type ZnSe, $ZnS_xSe_{1-x}$, $Zn_{1-x}Cd_xS$, $Zn_{1-x}Cd_xS_ySe_{1-y}$, $Zn_{1-x}Mg_xS_ySe_{1-y}$ (wherein x and y are a number selected from 0 to 1) and other II–VI compound semiconductors used in lasers grown on GaAs substrates. Due to the close lattice match to GaAs substrate, graded $(BeTe)_x (ZnSe)_{1-x}$ contact allow for the entire device structure to be grown within the pseudomorphic limit.

34 Claims, 5 Drawing Sheets

BETE-ZNSE GRADED BAND GAP OHMIC CONTACT TO P-TYPE ZNSE SEMICONDUCTORS

FIELD OF THE INVENTION

The present invention relates to ohmic contacts for semiconductor devices, to a method for producing ohmic contacts in semiconductor devices and most preferably in p-type Group II-IV compound semiconductors, and to diode lasers derived from the same.

BACKGROUND OF THE INVENTION

The successful p-type doping of ZnSe using nitrogen radicals as a dopant during molecular beam epitaxy growth has rapidly lead to the demonstration of blue-green laser diodes. See for example R. M. Park et al, *Appl. Phys. Lett.* 57,2127, (1990); K. Ohkawa et al, *Jpn. J. Appl. Phys.* 30, L152 (1991); M. A. Haase et al, *Appl. Phys. Lett.* 59, 1273 (1991); and H. Leon et al, *Appl. Phys. Lett* 59, 3619 (1991).

Perhaps the most important obstacle preventing widespread use of these ZnSe-based blue-green lasers and maturing of this technology is the difficulty in fabricating low resistivity Ohmic contacts to p-type, normal thickness ZnSe-based cladding layers, eg, ZnSe, $ZnS_xSe_{1-x}$ and $Zn_{1-x}Mg_xS_ySe_{1-y}$. Gold (Au) electrodes which are typically involved in the formation of electrical contacts, form a Schottky barrier on p-ZnSe in excess of 1.0 eV and no metal that has a work function that is high enough to lower that barrier has been found. Since ZnSe: N layers can be doped at most (so far) in the low $10^{18}$ cm$^{-3}$ range, a realization of tunnelling metal-semiconductor junctions for electrical contact purposes is extremely difficult and has not been feasible. There is thus a need for an alternative solution to the problem. Reduction of the valence band affinity of the semiconductor near the surface by use of a graded gap semiconductor layer comes to mind as one method that may prove to be successful. Such a technique for producing Ohmic contact to n-GaAs has been reported. (See J. M. Woodall et al, *J. Vac. Sci. Technol.*, 19, 626, (1981).:1.

Recently, several groups reported some progress in improving electrical contacts to p-ZnSe. For example,- there have been developed: ZnSe:N contact layers by lowering the substrate temperature during molecular beam epitaxy growth to 150° C., and using a cracked Se source (J. Qui et al, *Proceedings of VII MBE Conference Schwabisch Gemund,* Germany, Aug. 24-28, 1992); a ZnSe/ZnTe multilayer structure used for a contact layer to achieve a graded band gap effect from p-ZnSe to p-ZnTe (Y. Fan et al, *Appl. Phys. Lett.* 61, 3161, 1992); improved electrical contact to p-ZnSe by use of high affinity, semi-metallic HgSe, grown by MBE (Y. Lansari et al, *Appl. Phys. Lett.* 61,2554, 1992. Although these improved contacts permitted performing Hall measurements on p-ZnSe, to date they have not reduced the operating voltage of blue-green lasers to any significant extent. While the exact reason is not known, perhaps due to the large lattice mismatch with GaAs substrate, the dislocated ZnTe, ZnTe/ZnSe, and HgSe contacting layers are not compatible with laser structures operating at high current conditions. In addition, ZnTe-ZnSe layers have a higher refractive index than the active region formed by ZnSe or $ZnCd_xSe_{1-x}$ layers, which has a detrimental effect on the optical confinement in the active region of the laser. To compensate for this effect, an extra-thick p-cladding layer would be required which further complicates matters since it is likely to increase the voltage threshold for laser emission.

SUMMARY OF THE INVENTION

An object of the present invention is to provide a method for ohmic contacts to ZnSe-based layers that are free of the problems met heretofore by prior art structures.

Another object of the invention is to provide ohmic contact to ZnSe-based layers by a method in which the valence band affinity of the semiconductor near the surface is reduced by use of a graded gap semiconductor layer.

Yet another object is to provide diode lasers derived from such Ohmic contacts and most preferably lasers of the blue-green type.

These and other objects of the invention are realized by the present invention in which BeTe is utilized in a graded band gap layer for Ohmic contact to p-type ZnSe, based semiconductors. Due to the close lattice match to GaAs and ZnSe and grown character, $Be_xZn_{1-x}Te_ySe_{1-y}$ graded band gap layers are ideal for Ohmic contact to p-type ZnSe based and other II-VI compound semiconductors. Especially preferred are such contacts such as $Be_xZn_{1-x}Te_xSe_{1-x}$ wherein x is a number selected from the range of 0 to 1. For ease of discussion, the compositions of the invention will be described with reference to the composition $Be_xZn_{1-x}Te_xSe_{1-x}$. These contacts allow for an implementation of epitaxial structures of II-VI compound diode lasers entirely lattice matched to the GaAs substrate with contact resistivity of $Be_xZn_{1-x}Te_xSe_{1-x}$ graded gap contacts lower than $\rho = 10^{-4} \Omega\text{cm}^{-2}$ at acceptor doping level $1 \times 10^{18}$ cm$^{-3}$, which corresponds to a voltage drop across the contact layer of less than 0.1 V during a lasing operation.

W. M. Yim et al, *J. Phys. Chem. Sol.*, 33, 501 (1972), has reported synthesis of BeTe single crystals and measured some basic parameters specifically confirming Zinc blend structure with lattice constants 5.6269 A, which is very closely matched to the lattice constants of GaAs and ZnSe, (5.6533 A and 5.6687 A, respectively). Yim et al also reported that the value of the band gap energy of BeTe is 2.7 eV at room temperature. Unintentional p-type doping with Hall carrier concentration of $1 \times 10^{14}$–$1 \times 10^{16}$ cm$^{-3}$ and indium forming ohmic contact to p-BeTe at room temperature was also reported by Yim et al. With this information as a starting point, we have estimated that the critical thickness for a strain BeTe layer, which has 0.47% lattice mismatched to the GaAs substrate, would be approximately 850 Angstrom. As will be illustrated below, we have determined that this thickness is sufficient for provision of a suitable $Be_xZn_{1-x}Te_xSe_{1-x}$ contact layer using currently accessible doping levels. Additionally, since it is known that the value of Schottky barrier height of In-metal on n-ZnSe equals 0.91 eV (See S Sze, *Physics of Semiconductor Devices,* 2nd Ed., p. 291, John Wiley & Sons (1981), we have estimated a valence band offset $\Delta E_v$ in BeTe/ZnSe heterojunction to be between 1.5 and 1.8 eV from the transitivity rule. We have thus found that similar to ZnTe/ZnSe heterojunction, BeTe/ZnSe forms a staggered heterojunction. Thus, according to the invention, BeTe-ZnSe graded gap semiconductor layers are provided for application as ohmic contacts to p- type ZnSe, $ZnS_xSe_{1-x}$, $Zn_{1-x}Cd_xS$, $Zn_{1-x}Cd_xS_ySe_{1-y}$, $Zn_{1-x}Mg_xS_ySe_{1-y}$ (wherein x and y are a number selected from 0 to 1) and other II-VI compound semiconductors used in lasers grown on GaAs substrates. Due to the close lattice match to GaAs substrate, $(BeTe)_x (ZnSe)_{1-x}$ contacts allow for the entire device structure to be grown within the pseudomorphic limit. Thus low density of dislocation can be achieved in these structures, which are potentially essential for the realization of long-lived blue-green diode lasers. Since the band gap energy of BeTe is higher than ZnSe, the refractive index of BeTe is expected to be lower than ZnSe or $ZnCd_xSe_{1-x}$, and optical confinement around an active region in a blue or blue-green laser will not be affected by these contacts.

The invention uses BeTe to form a compositional grading to ZnSe or other II-VI compound semiconductor lattice matched to GaAs. This lattice matching may prove to be critical for implementation onto room temperature operative diode lasers. Because of the lattice match of BeTe to GaAs and its wide band-gap (2.7 eV or more), the BeTe—ZnSe graded composition ohmic contacts are believed to be a practical and necessary solution for blue lasers grown on GaAs substrates.

DETAILED DESCRIPTION OF THE PREFERRED EMBODIMENTS

BeTe/ZnSe Ohmic contacts were modeled using the material constants listed in the Table.

TABLE OF CONSTANTS

| | ZnSe | BeTe |
|---|---|---|
| Bandgap [eV] | 2.67 | 2.70 |
| Electron affinity [eV] | 3.82 | 2.0 |
| Hole mobility [cm$^2$/V-s at $N_A = 10^{18}$cm$^{-3}$] | 20 | 20 |
| Electron mass [$m_e/m_o$] | 0.17 | 0.17 |
| Hole mass [$m_h/m_o$] | .65 | .65 |
| Acceptor ionization energy [meV] | 100 | 100 |
| Low frequency dielectric constant | 9.2 | 9.2 |

In the calculations which follow, material constants of $Be_xZn_{1-x}Te_xSe_{1-x}$ were obtained from linear interpolation of the ZnSe and BeTe parameters listed in the Table. The 2.0 eV value of electron affinity for BeTe results from the assumed 1.8 eV in valence band discontinuity of BeTe/ZnSe heterojunction. The energy-bands and current-voltage characteristics were calculated by solving Poison's equation with electron and hole continuity equations within one-dimensional heterostructures.

Figure 1A:
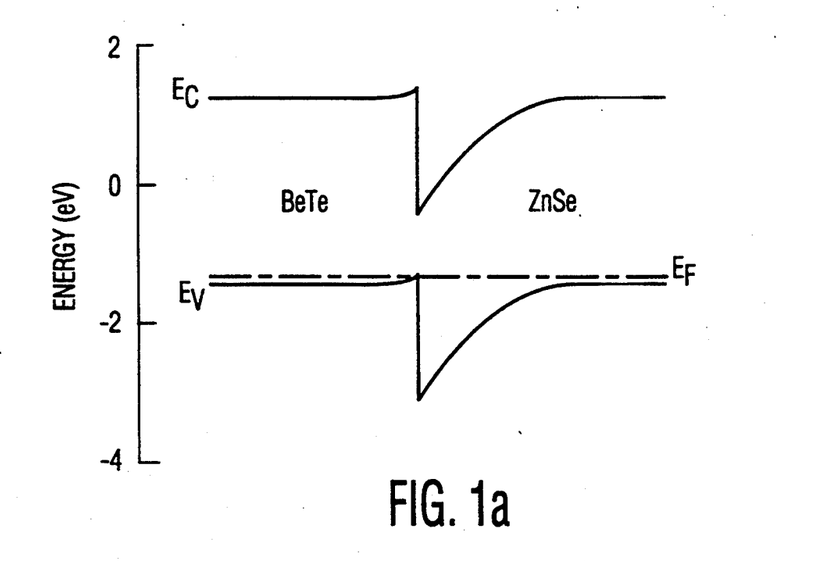
FIG. 1 is an energy-band diagram of a BeTe/ZnSe heterostructure according to the present invention.
Figure 1B:
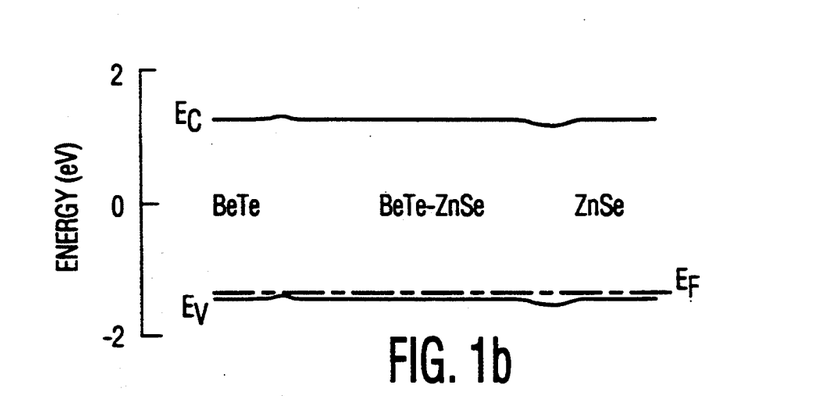

With reference to the drawings, FIG. 1a illustrates an energy band diagram of a staggered p-BeTe/p-ZnSe heterostructure for an assumed discontinuity in the valence band of $\Delta E_v = 1.8$ eV and uniform acceptor doping concentration of $N_a = 10^{18}$ cm$^{-3}$. In this case, a large barrier in valence band at the BeTe/ZnSe heterojunction would suppress transport of holes fron BeTe to ZnSe. A large valence band offset in abrupt BeTe/ZnSe heterojunction can almost entirely be removed if linearly graded heterojunction is used, as shown in FIG. 1b in which grading takes place from 200 to 1000 A which is indicated by arrows. In this case, the calculated energy-band diagram of $Be_xZn_{1-xl}Te_xSe_{1-x}$ layer was obtained for linearly varied compositions from x=0 to 1, over a distance of $w_j = 800$ A, and uniform doping at $N_A = 10^{18}$ cm$^{-3}$.

Figure 1C:
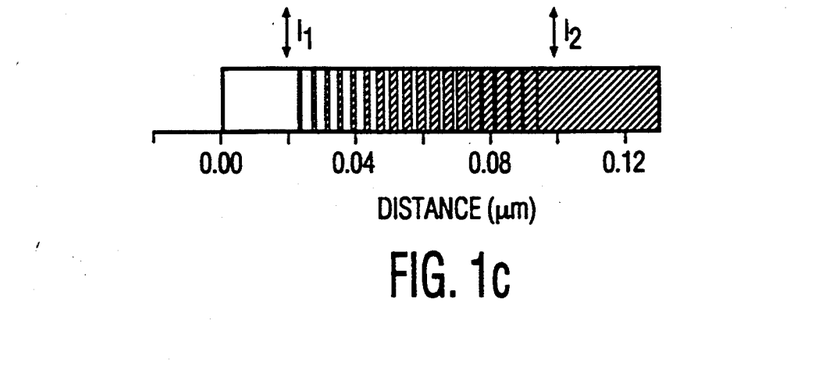

Although the layers may be grown by any of means known in the art, there are difficulties in molecular beam epitaxy arising from Te and Se segregation on the growth surface. Therefore, an epitaxial growth of BeTe-ZnSe graded layer is preferably done by digital technique in which layers of the graded components are alternately grown in predetermined thicknesses and numbers as represented by $(BeTe)_x (ZnSe)_{1-x}$. In a preferred method of preparation, instead of a gradual change of the parameter x in the $Be_xZn_{1-x}Te_xSe1-x$ layer, the region around BeTe/ZnSe junction, having the width $w_j$, was divided into a series of small segments containing x-portion ($0 \leq X \leq 1$) of p-BeTe layer, and remaining portion $(1-x)$ of p-ZnSe layer. Thus linearly graded composition junctions of $(BeTe)_x (ZnSe)_{1-x}$ are formed by growing interchangeably or alternately a stack of multiple p-BeTe and p-ZnSe layers of variable width. One such resulting structure is illustrated in FIG. 1c in which BeTe layers are illustrated as white bars and ZnSe layers are illustrated as black bars. In this example, the graded gap junction is divided into 20 segments, each 40 A wide. The first segment or layer, adjacent the BeTe top layer, (near $l_1$), contains 0 A of ZnSe and 40 A of BeTe; the second segment contains 2 A of p-ZnSe and 38 A of p-BeTe; the third segment has 4 A of p-ZnSe and 36 A of p-BeTe, etc. Thus, it will be seen that starting with a layer of 40 A BeTe, for every 40 A a width of the ZnSe layer is increased by 2 A and the width of the BeTe layer is reduced by 2 A until a layer of 40 A ZnSe is reached. The contacting layer of 200 A of BeTe and 800 A of linearly graded junction to ZnSe is still well below critical layer thickness for BeTe pseudomorphic growth.

In an alternative embodiment, a $(BeTe)_x (ZnSe)_{1-x}$ linearly graded junction is prepared by growing a stack of monolayers of BeTe and ZnSe to a junction width, $w_j = 816$ A wide, consisting of 17 segments, of which the first segment contains 17 monolayers of BeTe, the second one contains 1 monolayer of BeTe and 16 monolayers of ZnSe, the third one contains 2 monolayers of ZnSe and 15 monolayers of BeTe, etc. Due to the possibility of Te and Se segregation (clustering), the digital grading using full monolayer growth is preferable for the preparation of $(BeTe)_x(ZnSe)_x$ contacts.

Figure 2:
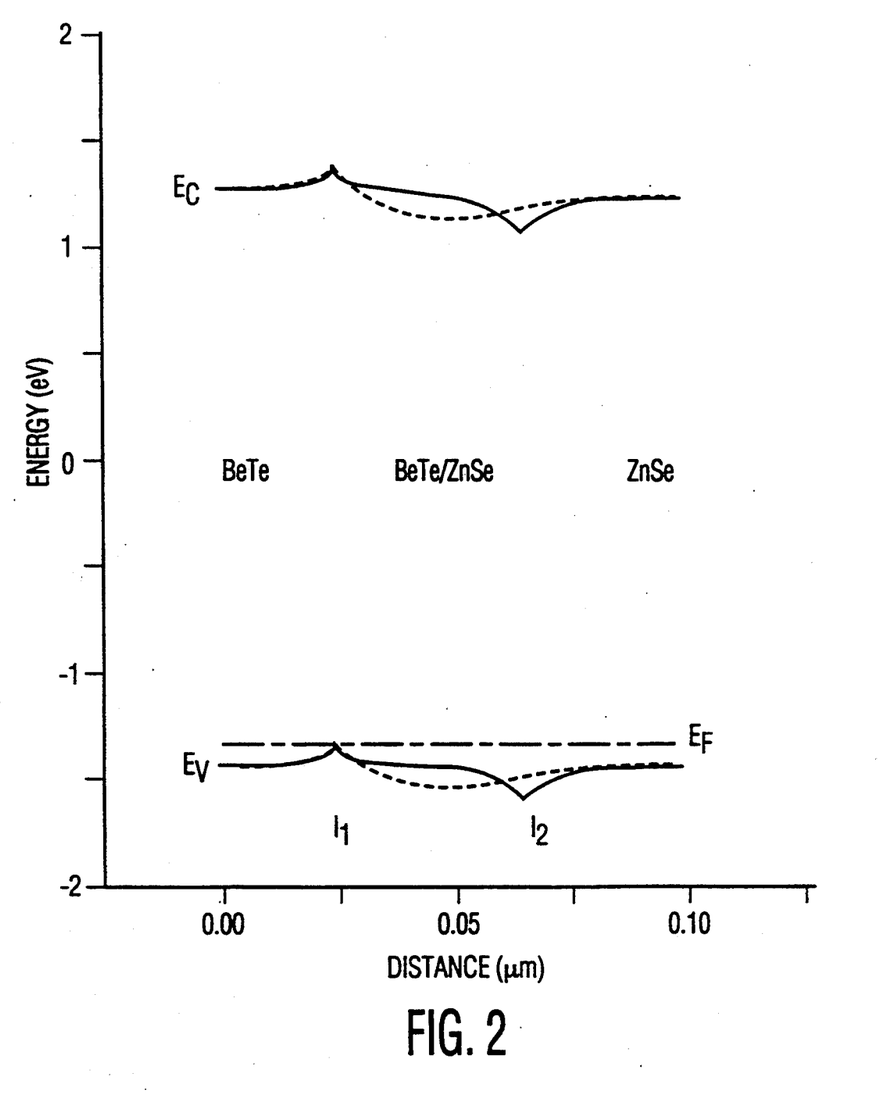
FIG. 2 is an energy-band diagram for linear and quadratic p-$Be_xZn_{1-x}Te_xSe_{1-x}$ graded junction of the invention having a width $w_j = 400$ A.

With reference to FIGS. 2 and 3, there are illustrated the energy band diagram for linear (solid line) and quadratic (dashed line) $Be_xZn_{1-x}Te_xSe_{1-x}$ graded junctions of several widths. The cusps in the valence band appearing near the edges of the graded $Be_xZn_{1-x}Te_x$-$Se_{1-x}$ layers at $l_1 = 200$ A and $l_2 = 1000$ A limits the carrier transport across the junction only marginally at room temperature. These cusps originate from the discontinuity of the derivative, $dE_v/d_x$, and can be reduced if quadratic, instead of linear, grading of x-composition in $Be_xZn_{1-x}Te_xSe_{1-x}$ is used near the edges of the graded-gap layer. As used herein, linear grading means x changes as a linear function of the distance from the surface and correspondingly, quadratic grading means x-changes as a quadratic function of the distance from the surface. For example, in the case of desired graded band gap layers of $Be_xZn_{1-x}Te_xSe_{1-x}$ for Ohmic contacts to p-ZnSe, with x varied linearly as a function of a distance from the surface 1, $$x(l) = \frac{l - l_2}{l_1 - l_2}$$

or quadratically $$x(l) = \frac{(l - l_2)^2}{(l_1 - l_2)^2}$$

where $l_1$ and $l_2$ are distances from the surface of the $Be_xZn_{1-x}Te_xSe_{1-x}$ sample and $x=1$ and $x=0$, respectively. A comparison of the energy band diagram for linear (solid line) and quadratic (dashed line) $Be_xZn_{1-x}Te_xSe_{1-x}$ graded junction of width $w_j=400$ A is illustrated in FIG. 2. The cusps in the valence band appearing in linearly graded junction near the edges of the linearly graded $Be_xZn_{1-x}Te_xSe_{1-x}$ junction at $l_1$ and $l_2$ act on a hole transport as a trap and a barrier, respectively, i.e. the cusps act as a well and a barrier for mobile holes, respectively. The detrimental influence of the barrier around $l_2$ on the contact resistance is more significant, and can be reduced by introducing quadratic grading through the entire $Be_xZn_{1-x}Te_xSe_{1-x}$ layer, as illustrated in FIG. 2. This becomes quite apparent from the comparison of the calculated current-voltage characteristics of the quadratically and linearly graded contacts shown in FIG. 3 by curves 1 and 5. FIG. 3 also shows current-voltage characteristics calculated for various doping and grading dependence in $Be_xZn_{1-x}Te_xSe_{1-x}$ contacts. As illustrated, the continuous lines correspond to linearly graded p-$Be_xZn_{1-x}Te_xSe_{1-x}$ junctions doped uniformly at 1 and $2 \times 10^{18}$ cm$^{-3}$ (curves 1 and 2, respectively), and linearly doped from $10^{18}$ cm$^{-3}$ at $l_2$, to 5 and $10 \times 10^{18}$ cm$^{-3}$ at $l_1$ (curves 3 and 4, respectively). The dotted line in FIG. 3 (curve 5) corresponds to quadratically graded $Be_xZn_{1-x}Te_xSe_{1-x}$ layers doped uniformly with acceptors at $1 \times 10^{18}$ is cm$^{-3}$ level.

Figure 3A:
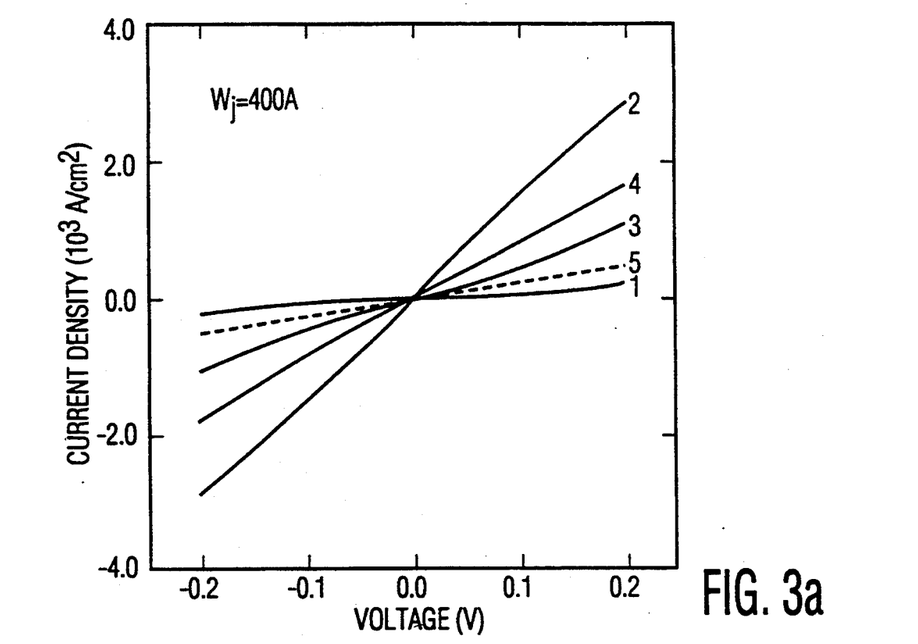
FIG. 3a is a current-voltage characteristic of the graded gap $Be_xZn_{1-x}Te_xSe_{1-x}$ heterojunction for junction of the invention having a width $w_j = 400$ A.
Figure 3B:
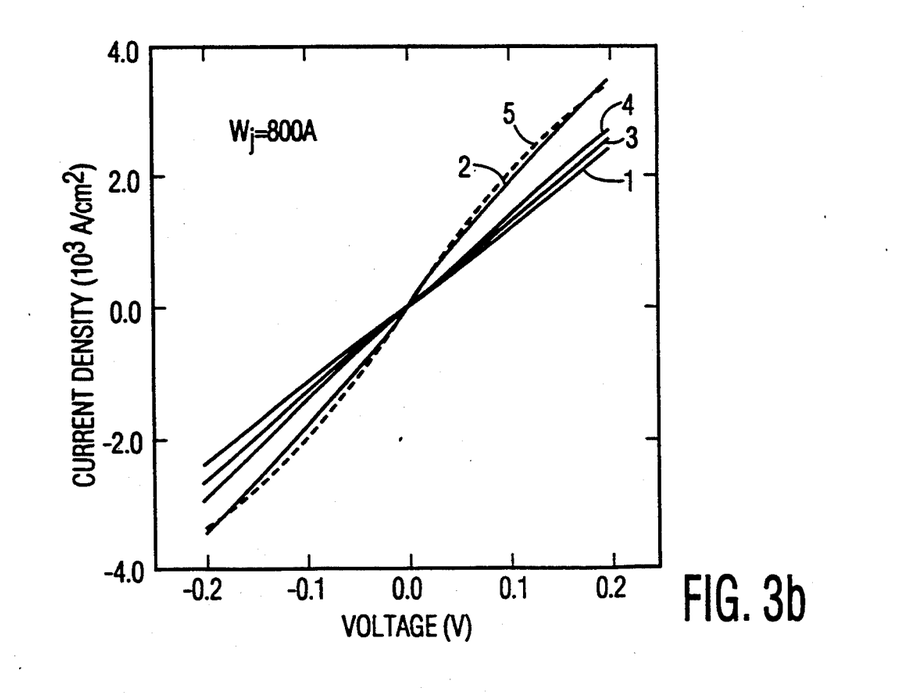
FIG. 3b is a current-voltage characteristic of the graded gap p-$Be_xZn_{1-x}Te_xSe_{1-x}$ heterojunction for junction of the invention having a width $w_j = 800$ A.

The characteristics illustrated in FIG. 3 show that for a graded $Be_xZn_{1-x}Te_xSe_{1-x}$ layer of width $w_j=400$ A, acceptor doping of $1 \times 10^{18}$ cm$^{-3}$ will not be sufficient to achieve an Ohmic current-voltage characteristic (see curve 1). The quadratic grading (curve 5) makes it feasible to achieve an Ohmic characteristic but with a rather large contact resistivity of $\rho = 4 \times 10^{-4}$ $\Omega$cm$^2$. Additionally, as illustrated in FIG. 3a, an increase in doping level of p-ZnSe to $2 \times 10^{18}$ cm$^{-3}$ lowers the contact resistivity of $Be_xZn_{1-x}Te_xSe_{1-x}$ linearly graded layers more significantly than an increase in doping in p-BeTe, even at as high a level as $1 \times 10^{19}$ cm3. Therefore, if an upper limit of p-ZnSe doping is selected to be $1 \times 10^{18}$ cm$^{-3}$, the junction width, $w_j$, of the $Be_xZn_{1-x}Te_xSe_{1-x}$ layer should be increased. FIG. 3b illustrates that doubling the $Be_xZn_{1-x}Te_xSe_{1-x}$ layer thickness to $w_j=800$ A produces low resistive Ohmic contacts in all instances considered. In particular, for linearly graded p-$Be_xZn_{1-x}Te_xSe_{1-x}$ layer with acceptor doping at $1 \times 10^{18}$ cm$^{-3}$, a contact resistivity of $\rho_c=8 \times 10^{-5}$ $\Omega$cm$^2$ is obtained.

Figure 4:
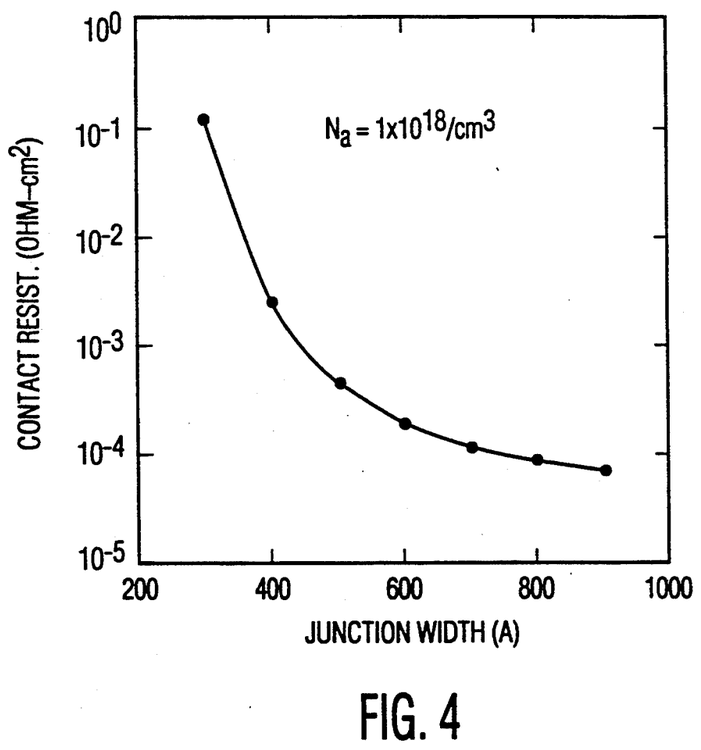
FIG. 4 is a graph of the dependence of the contact resistivity of linearly graded p-$Be_xZn_{1-x}Te_xSe_{1-x}$ junctions, uniformly doped at $1 \times 10^{18}$ cm$^{-3}$ upon the junction width.

The contact resistance of the linearly graded p-$Be_xZn_{1-x}Te_xSe_{1-x}$ layers as a function of the junction width $w_j$, for uniform doping at $1 \times 10^{18}$ cm$^{-3}$ is illustrated in FIG. 4. The structure included 200 A p-BeTe and 300–900 A p-$Be_xZn_{1-x}Te_xSe_{1-x}$ where the total thickness will still allow for psuedomorphic growth of these layers on GaAs substrate and for the production of blue laser structures entirely lattice matched to GaAs substrate. As illustrated in FIG. 4, such a laser operating at current density of $j=10^3$ A/cm$^2$ at room temperature would exhibit a voltage drop less than 0.1 V across the $Be_xZn_{1-x}Te_xSe_{1-x}$ contacting layer. This drastically reduces the power dissipation across electrical contacts, which is highly desirable for reliable blue laser operation in continuous mode at room temperature.

Figure 5:
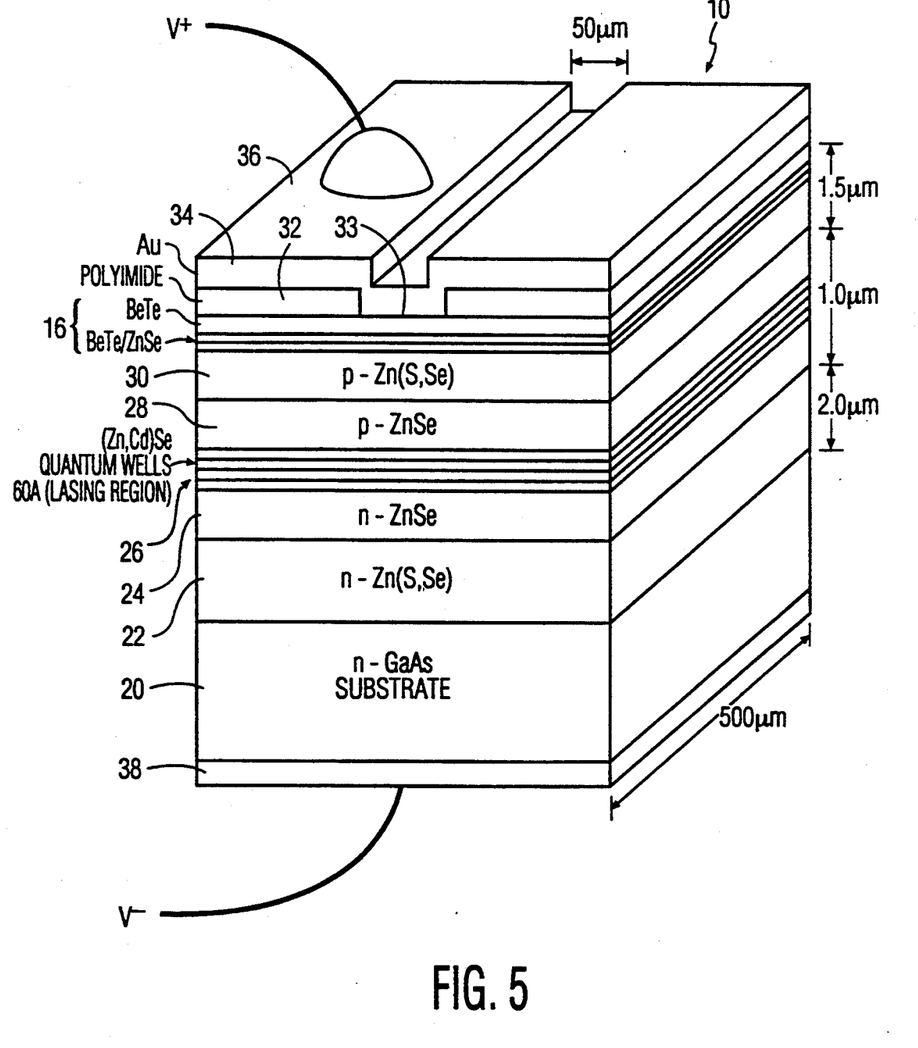
FIG. 5 is a cross-sectional view illustrating the structure of a II-VI laser diode which includes a p-type ohmic contact of this invention.

The graded $Be_xZn_{1-x}Te_xSe_{1-x}$ layer may be utilized to fabricate blue-green lasers according to methods such as, for example that described in Gaines et al, *Appl. Phys. Lett.*, 62 (20), pp. 2462 (1993) and in Gaines et al, copending U.S. application Ser. No. 07/997,988 filed December 1992, now allowed. Particularly preferred is a structure as illustrated in FIG. 5 which illustrates a laser diode 10 which may be generally be grown by molecular beam epitaxy (MBE) on a GaAs substrate 20 and includes an ohmic contact layer 16 which comprises a graded band gap $Be_xZn_{1-x}Te_xSe_{1-x}$ composition of the invention. Grown on the substrate is a bottom waveguide cladding layer 22 of $ZnS_xSe_{1-x}$ which by its doping is n-type. Grown atop cladding layer 22 is a layer of ZnSe 24 which forms the bottom half of the waveguide. Grown on layer 24 is an active region 26 consisting of three undoped $Cd_uZn_{1-u}Se$ quantum wells separated by two undoped ZnSe spacer regions. Grown on active region 26 is a p-ZnSe guiding layer 28. Grown on layer 28 is a p- $ZnS_zSe_{1-z}$ top waveguide cladding layer 30. As mentioned above, disposed on layer 30 is an ohmic contact layer 16 which comprises a graded band gap $Be_xZn_{1-x}Te_xSe_{1-x}$ composition of the invention. A polyimide insulator layer 32 with openings is applied and contacts to the contact layer 16 and the GaAs substrate were made with a gold layer 34.

Source materials may be selected from those well known in the art and are preferably Zn, Se, Cd, and ZnS. The p- and n- type dopants may be N, excited by a plasma source, and Cl (from ZnCl$_2$), respectively.

Doping levels and processing may be as described in said copending application, i.e. the doping levels for the layers 22, 24, 28 and 30 are approximately $1 \times 10^{18}$, $3 \times 10^{17}$, and $2 \times 10^{17}$ cm$^{-3}$, respectively. The doping level in the p- $ZnS_zSe_{1-z}$ layer 30 may be $2 \times 10^{17}$ cm$^{-3}$ and that in the graded band gap composition layer 16 may be approximately at the levels discussed above with respect to FIGS. 3 and 4, i.e. doping will vary depending on the grading and the particular area of the grading, the junction width, etc, and is preferably at least $1 \times 10^{18}$ cm$^{-3}$.

The thickness of each of the layers is grown in a manner so as to minimize the loss of light in absorbing layers and maximize the amount of light in the active region with specific thicknesses being illustrated in FIG. 5 for purposes of illustration only. By way of example only, useful devices may be made with a n-type cladding layer 22 of 2.0 microns, an n-type guiding layers 24 and 30, including the quantum well region 26 having a thickness of about 60 A with about 110 A thick ZnSe spacers in between, has a total thickness of approximately 1 micron. The p-type top cladding layer 30 and the p-type graded band gap contact layer 16 have a total thickness of about 1.5 micron, the cap graded contact layer having a thickness of approximately 400 to 800 A.

Suitable ranges for u (cadmium) are from 0 to 1.0 z from 0 to 0.1, y from 0 to 1 and x from 0 to 1, with x an y being selected to provide lattice matching to GaAs. In order to improve the optical output of the device, facet coatings 36 and 38 may be applied to the device. The cleaving of the device to its useful length provides the necessary "mirror" action to provide laser stimulation. The light output may be shifted towards blue by reducing the thickness of active region 26 and/or by reducing the cadmium content of this layer (u approaches 0).

In the above-described embodiment of FIG. 5, the substrate and lower layers are n-type with the upper layers being p-type. An analogous structure can be grown with the lower layers p-type and the upper layers n-type.

Although the present invention has been described in conjunction with preferred embodiments, it is to be understood that modifications and variations may be resorted to without departing from the spirit and scope of the invention as will be readily understood by those skilled in the art.

I claim:

1. An ohmic contact joining a metal member to a Group II–VI compound semiconductor device which comprises a substrate, said contact comprising a layer consisting essentially of a BeTe-containing material effective to reduce the valence band affinity of the semiconductor near the surface, said layer of BeTe-containing material consisting essentially of a graded composition of $Be_xZn_{1-x}Te_xSe_{1-x}$ wherein x is within the range of 0 and 1 selected so as to provide a lattice structure in said graded composition that matches substantially the lattice structure of the substrate.

2. An Ohmic contact as claimed in claim 1 wherein said contact has a contact resistivity lower than $p_c = 10^{-4} \Omega cm^2$ at acceptor doping level $1 \times 10^{18} cm^{-3}$.

3. An Ohmic contact as claimed in claim 1 wherein said graded composition is obtained by molecular beam epitaxial growth of alternately grown layers of BeTe and ZnSe.

4. An ohmic contact as claimed in claim 3 wherein the graded composition comprises a BeTe top layer grown on a series of layers wherein the parameter x gradually changes from 1 to 0.

5. An ohmic contact as claimed in claim 3 wherein said layer of graded BeTe-containing material includes a region around a BeTe/ZnSe junction having a width $w_j$.

6. An ohmic contact as claimed in claim 5 wherein said region is divided into a series of segments $(BeTe)_x$ and $(ZnSe)_{1-x}$ grown alternately.

7. An ohmic contact as claimed in claim 6 in which there are a plurality of segments each having a width of 40 A, the value of x varying from 1 to 0 from the top segment to the bottom segment and the thickness of the BeTe content of the segment decreasing and the ZnSe content increasing in increments of 2 A from the top segment to the bottom segment.

8. An ohmic contact as claimed in claim 6 in which there are a plurality of segments, the content of each segment being alternately multiple monolayers of BeTe and ZnSe and mixtures thereof, graded from a top segment of multiple monolayers of BeTe to a bottom segment of monolayers of ZnSe.

9. A II–VI compound diode laser structure comprising an ohmic contact joining a metal member to a Group II–VI compound semiconductor body including a substrate, said contact comprising a layer consisting essentially of a BeTe-containing material effective to reduce the valence band affinity of the semiconductor near the surface; said layer being epitaxially grown on said semiconductor body, being substantially entirely lattice matched to the substrate, and consisting essentially of $Be_xZn_{1-x}Te_xSe_{1-x}$ wherein x is within the range of 0 and 1 selected so as to provide lattice matching to the substrate.

10. A laser structure as claimed in claim 9 wherein said contact has a contact resistivity lower than $p_c = 10^{-4} \Omega cm^2$ at acceptor doping level $1 \times 10^{18} cm^{-3}$.

11. A laser structure as claimed in claim 9 wherein said graded composition is obtained by molecular beam epitaxial growth of alternately grown layers of BeTe and ZnSe, 12. A laser structure as claimed in claim 11 wherein the graded composition comprises a BeTe top layer grown on a series of layers wherein the parameter x gradually changes from 1 to 0.

13. A laser structure as claimed in claim 11 wherein said layer of graded BeTe-containing material includes a region around a BeTe/ZnSe junction having a width $w_j$.

14. A laser structure as claimed in claim 13 wherein said region is divided into a series of segments $(BeTe)_x$ and $(ZnSe)_{1-x}$ grown alternately.

15. A laser structure as claimed in claim 14 in which there are a plurality of segments each having a width of 40 A, the value of x varying from 1 to 0 from the top segment to the bottom segment and the thickness of the BeTe content of the segment decreasing and the ZnSe content increasing in increments of 2 A from the top segment to the bottom segment.

16. A laser structure as claimed in claim 14 in which there are a plurality of segments, the content of each segment being alternately multiple monolayers of BeTe and ZnSe and mixtures thereof, graded from a top segment of multiple monolayers of BeTe to a bottom segment of monolayers of ZnSe.

17. A laser structure comprising:
(a) a substrate of a first conductivity type;
(b) a cladding layer of first conductivity type disposed atop said substrate;
(c) a guiding layer of said first conductivity type disposed atop said first conductivity type cladding layer;
(d) an active layer disposed atop said first conductivity type guiding layer;
(e) a guiding layer of a second conductivity type opposite said first conductivity type, disposed atop said active layer;
(f) a cladding layer of said second conductivity type; and
(g) an ohmic contact layer of BeTe-containing graded composition which consists essentially of $Be_xZn_{1-x}Te_xSe^{1-x}$ wherein x is within the range of 0 and 1 selected so as to provide substantial lattice matching to the lattice structure of the substrate.

18. An ohmic contact joining a metal member to a Group II–VI compound semiconductor device containing p-ZnSe and a GaAs substrate, said contact comprising a layer consisting essentially of a p-BeTe-containing material effective to reduce the valence band affinity of the semiconductor near the surface, said layer of BeTe-containing material consisting essentially of a graded composition of $Be_xZn_{1-x}Te_xSe_{1-x}$ wherein x is within the range of 0 and 1 selected so as to provide a lattice structure in said graded composition that matches substantially the lattice structure of the p-GaAs substrate.

19. An Ohmic contact as claimed in claim 18 wherein said contact has a contact resistivity lower than $p_c = 10^{-4} \Omega cm^2$ at acceptor doping level $1 \times 10^{18}$ cm$^{-3}$.

20. An Ohmic contact as claimed in claim 18 wherein said graded composition is obtained by molecular beam epitaxial growth of alternately grown layers of BeTe and ZnSe.

21. An ohmic contact as claimed in claim 20 wherein the graded composition comprises a BeTe top layer grown on a series of layers wherein the parameter x gradually changes from 1 to 0.

22. An ohmic contact as claimed in claim 20 wherein said layer of graded BeTe-containing material includes a region around a BeTe/ZnSe junction having a width $w_j$.

23. An ohmic contact as claimed in claim 22 wherein said region is divided into a series of segments $(BeTe)_x$ and $(ZnSe)_{1-x}$ grown alternately.

24. An ohmic contact as claimed in claim 23 in which there are a plurality of segments each having a width of 40 A, the value of x varying from 1 to 0 from the top segment to the bottom segment and the thickness of the BeTe content of the segment decreasing and the ZnSe content increasing in increments of 2 A from the top segment to the bottom segment.

25. An ohmic contact as claimed in claim 23 in which there are a plurality of segments, the content of each segment being alternately multiple monolayers of (BeTe) and (ZnSe) and mixtures thereof, graded from a top segment of multiple monolayers of (BeTe) to a bottom segment of monolayers of (ZnSe).

26. A II–VI compound diode laser structure comprising an ohmic contact joining a metal member to a Group II–VI compound semiconductor body containing ZnSe and including a GaAs substrate, said contact comprising a layer consisting essentially of a BeTe-containing material effective to reduce the valence band affinity of the semiconductor near the surface; said layer being substantially entirely lattice matched to the substrate, and consisting essentially of $Be_xZn_{1-x}Te_xSe_{1-x}$ wherein x is within the range of 0 and 1 selected so as to provide said lattice matching to the substrate.

27. A laser structure as claimed in claim 26 wherein said contact has a contact resistivity lower than $\rho = 10^{-4} \Omega cm^2$ at acceptor doping level $1 \times 10^{18}$ cm$^{-3}$.

28. A laser structure as claimed in claim 27 wherein said graded composition is obtained by molecular beam epitaxial growth of alternately grown layers of BeTe and ZnSe.

29. A laser structure as claimed in claim 28 wherein the graded composition comprises a BeTe top layer grown on a series of layers wherein the parameter x gradually changes from 1 to 0.

30. A laser structure as claimed in claim 26 wherein said layer of graded BeTe-containing material includes a region around a BeTe/ZnSe junction having a width $w_j$.

31. A laser structure as claimed in claim 30 wherein said region is divided into a series of segments $(BeTe)_x$ and $(ZnSe)_{1-x}$ grown alternately.

32. A laser structure as claimed in claim 30 in which there are a plurality of segments each having a width of 40 A, the value of x varying from 1 to 0 from the top segment to the bottom segment and the thickness of the BeTe content of the segment decreasing and the ZnSe content increasing in increments of 2 A from the top segment to the bottom segment.

33. A laser structure as claimed in claim 32 in which there are a plurality of segments, the content of each segment being alternately multiple monolayers of (BeTe) and (ZnSe) and mixtures thereof, graded from a top segment of multiple monolayers of (BeTe) to a bottom segment of monolayers of (ZnSe).

34. A laser structure comprising:
(a) an n-GaAs substrate;
(b) a n-ZnSe-containing cladding layer disposed atop said GaAs substrate;
(c) a n-ZnSe guiding layer disposed atop said n-ZnSe-containing cladding layer;
(d) an active layer disposed atop said n-ZnSe guiding layer;
(e) a p-ZnSe guiding layer disposed atop said active layer;
(f) a p-ZnSe-containing cladding layer disposed atop said p-ZnSe guiding layer; and
(g) an ohmic contact layer of BeTe-containing graded composition which consists essentially of $Be_xZn_{1-x}Te_xSe_{1-x}$ wherein x is within the range of 0 and 1 selected so as to provide substantial lattice matching to the lattice structure of the n-GaAs substrate.

* * * * *